(12) United States Patent
Taylor et al.

(10) Patent No.: US 7,295,433 B2
(45) Date of Patent: Nov. 13, 2007

(54) ELECTRONICS ASSEMBLY HAVING MULTIPLE SIDE COOLING AND METHOD

(75) Inventors: Ralph S. Taylor, Noblesville, IN (US); Michael A. Jeter, Kokomo, IN (US); Erich W. Gerbsch, Cicero, IN (US); Jeffrey J. Ronning, Tipton, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/262,400

(22) Filed: Oct. 28, 2005

(65) Prior Publication Data

US 2007/0097627 A1    May 3, 2007

(51) Int. Cl.
*H05K 7/20* (2006.01)

(52) U.S. Cl. ............. 361/689; 361/688; 174/15.1

(58) Field of Classification Search .......... 361/689, 361/704, 699, 698, 719, 688, 692, 696, 705, 361/706, 702, 715, 728; 165/80.4, 80.5; 174/15.1
See application file for complete search history.

(56) References Cited

U.S. PATENT DOCUMENTS

| | | | |
|---|---|---|---|
| 4,843,695 A * | 7/1989 | Doe et al. ............... 29/827 |
| 6,233,150 B1 * | 5/2001 | Lin et al. ............... 361/704 |
| 6,343,020 B1 * | 1/2002 | Lin et al. ............... 361/816 |
| 6,424,532 B2 * | 7/2002 | Kawamura ............ 361/708 |
| 6,449,156 B1 * | 9/2002 | Han et al. .............. 361/704 |
| 6,580,611 B1 * | 6/2003 | Vandentop et al. .... 361/704 |
| 6,639,798 B1 * | 10/2003 | Jeter et al. ............. 361/699 |
| 6,800,949 B1 * | 10/2004 | Trautvetter ............ 257/794 |
| 6,812,553 B2 | 11/2004 | Gerbsch et al. |
| 6,888,719 B1 * | 5/2005 | Janzen et al. .......... 361/687 |
| 7,023,700 B2 * | 4/2006 | Chiou et al. ........... 361/704 |
| 7,094,459 B2 * | 8/2006 | Takahashi .............. 428/68 |
| 2004/0094828 A1 | 5/2004 | Campbell et al. |
| 2005/0077614 A1 | 4/2005 | Chengalva et al. |
| 2005/0141199 A1 * | 6/2005 | Chiou et al. ........... 361/704 |
| 2005/0224954 A1 * | 10/2005 | Kelly .................... 257/706 |
| 2006/0050483 A1 * | 3/2006 | Wilson et al. ......... 361/702 |
| 2006/0067054 A1 * | 3/2006 | Wang et al. ........... 361/704 |

* cited by examiner

*Primary Examiner*—Lisa Lea-Edmonds
*Assistant Examiner*—Anthony M Haughton
(74) *Attorney, Agent, or Firm*—Jimmy L. Funke

(57) ABSTRACT

An electronics assembly is provided having a substrate and at least one electronics package supported on the substrate. The electronics package also has electrical circuitry and first and second side surfaces. The assembly further includes a first heat sink device positioned in thermal communication with the first side surface of the electronics package, and a second heat sink device positioned in thermal communication with the second side surface of the electronics package.

21 Claims, 3 Drawing Sheets

ELECTRONICS ASSEMBLY HAVING MULTIPLE SIDE COOLING AND METHOD

TECHNICAL FIELD

The present invention generally relates to cooling of heat generating electronics and, more particularly, relates to an electronics assembly having enhanced thermal energy dissipation for cooling electronics device(s).

BACKGROUND OF THE INVENTION

Power electronics devices employ electronics packages that generally contain electrical circuitry for conducting electrical current which, in turn, generates thermal energy (i.e., heat). Automotive high-power electronics, such as those employed in electric and hybrid-electric vehicles typically generate a significant amount of thermal energy during operation. Excessive temperatures may cause reduced performance including electrical circuit failure. Thus, thermal energy must be dissipated and transferred away from the electronics to ensure proper operation of the assembly. Additionally, the power capability of the electronics package and size of the electronics assembly generally depends upon the efficiency of heat dissipation that may be achieved.

Conventional electronics cooling approaches for dissipating thermal energy away from electronics include the use of a thermally conductive heat sink supported in contact with a surface of the electronics package(s). This may include directly mounting a heat sink onto a printed circuit board which, in turn, contains the electronics package(s) (devices). The heat sink transfers heat that dissipates through the printed circuit board away from the electronics devices. One such example of a prior electronics cooling package is disclosed in U.S. Patent Application Publication No. 2005/0077614 A1, the entire disclosure of which is hereby incorporated herein by reference.

For very high power applications, such as electronics packages that may be used in hybrid-electric or electric vehicles, enhanced cooling of electronics may be required. U.S. Pat. No. 6,639,798 discloses an automotive electronics heat exchanger employing a heat sink device having a fluid vessel in fluid communication with an automotive radiator. The heat sink is positioned in thermal communication with one side of an electronics power package such that fluid coolant flows through the heat sink device to cool the electronics package. The entire disclosure of the aforementioned patent is hereby incorporated herein by reference.

While prior known electronics cooling approaches achieve significant cooling, it is desirable to provide for an enhanced electronics assembly that is capable of dissipating greater amounts of thermal energy (heat) away from the electronics packages in an optimal manner. It is particularly desirable to provide for cost affordable and enhanced cooling of automotive electronics to cool high power electronics packages employed on an automotive vehicle.

SUMMARY OF THE INVENTION

According to one aspect of the present invention, an electronics assembly is provided having a substrate and at least one electronics package supported on the substrate. The electronics package has electrical circuitry and first and second side surfaces. The electronics assembly further includes a first heat sink device positioned in thermal communication with the first side surface of the electronics package, and a second heat sink device positioned in thermal communication with the second side surface of the electronics package.

According to a further aspect of the present invention, a method of cooling electronics in an electronics assembly is provided. The method includes the steps of providing at least one electronics package supported on a substrate, disposing a first heat sink device in thermal communication with one side surface of the electronics package, and disposing a second heat sink device in thermal communication with a second side surface of the electronics package. The method further includes the step of cooling the electronics package by flowing cooling fluid through the first and second heat sink devices to dissipate heat away from the first and second side surfaces of the electronics package.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
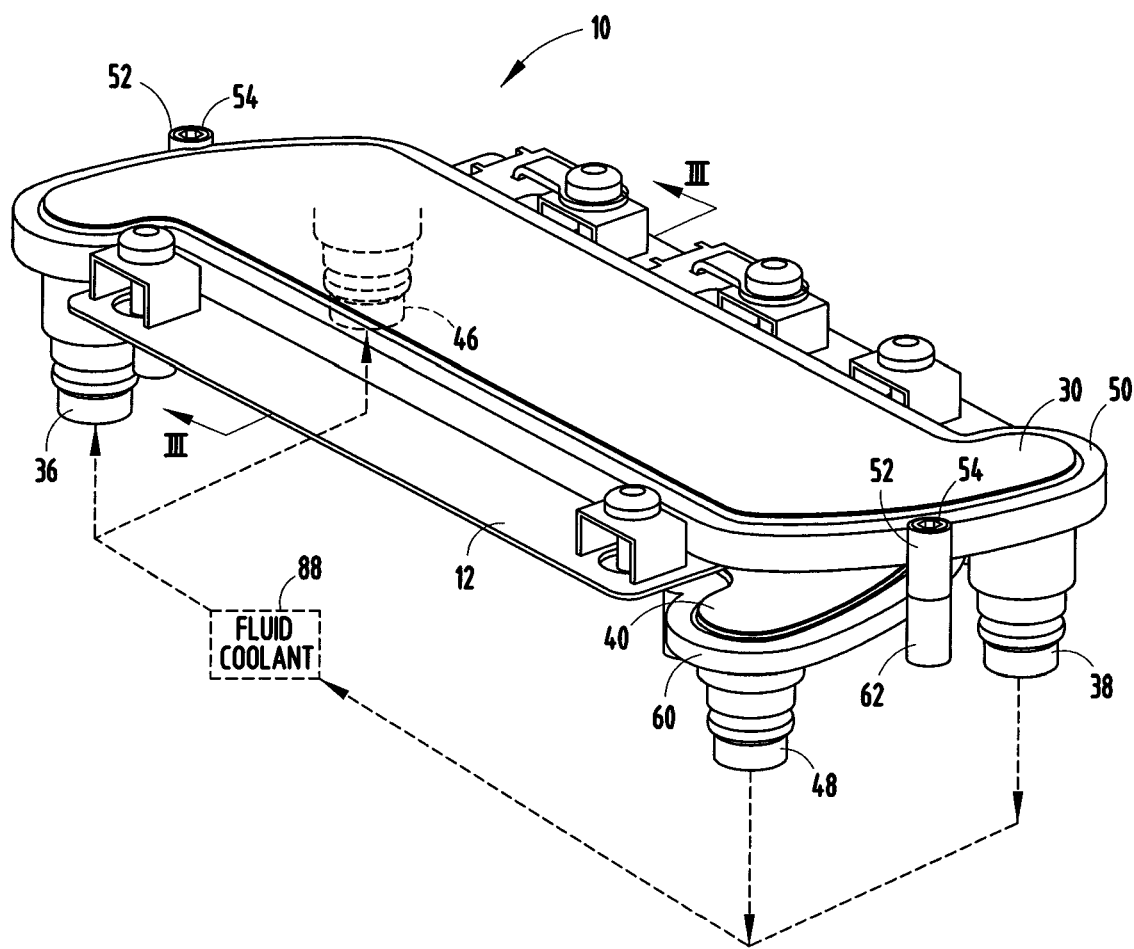
FIG. 1 is a perspective view of an electronics assembly employing fluid cooling devices according to the present invention.
Figure 2:
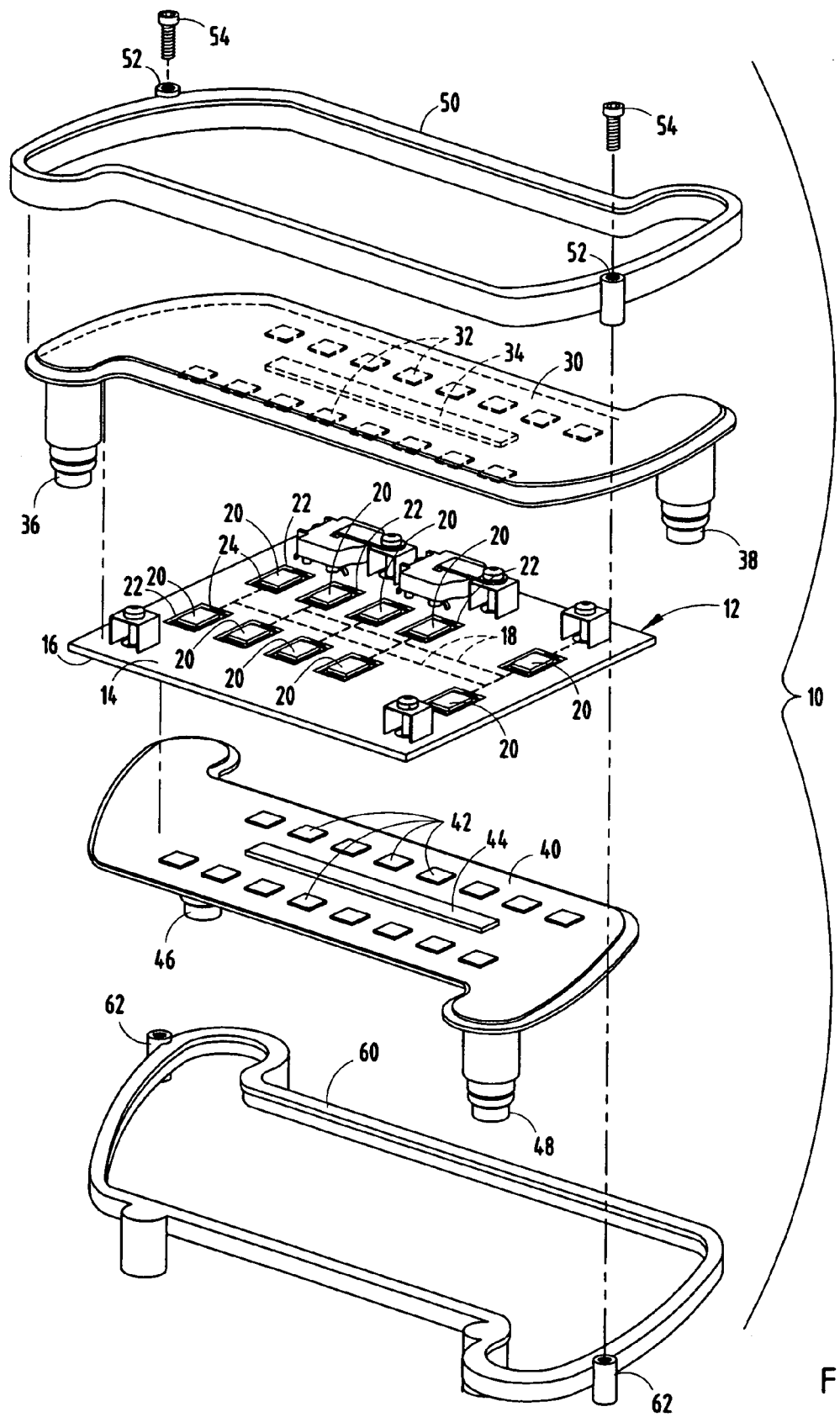
FIG. 2 is an exploded view of the electronics assembly shown in FIG. 1.
Figure 3:
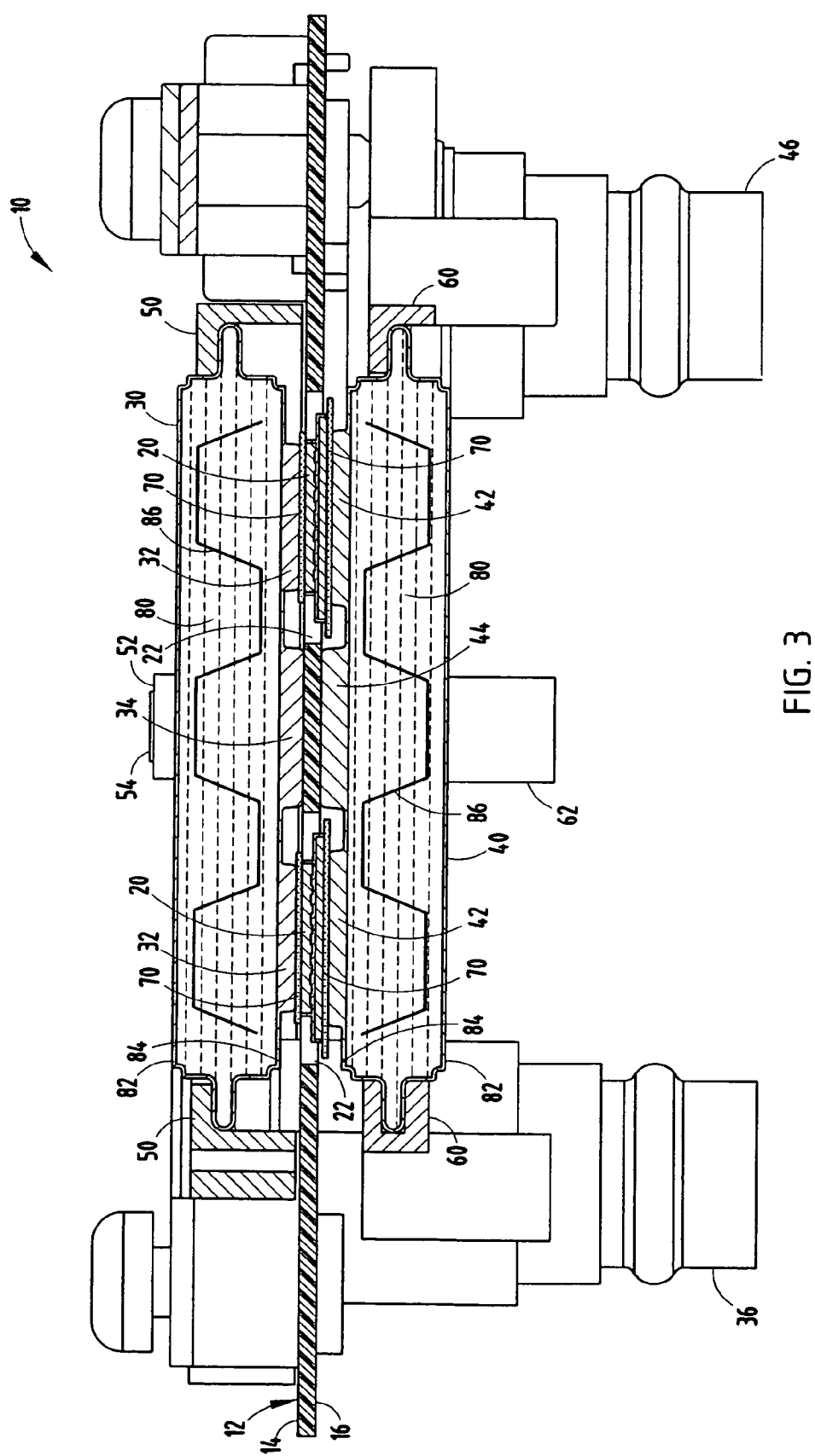
FIG. 3 is a cross-sectional view of the electronics assembly taken through line III-III in FIG. 1.

Referring to FIGS. 1-3, an electronics assembly 10 is generally illustrated according to one embodiment of the present invention. The electronics assembly 10 includes a substrate 12, such as a printed circuit board, containing electrical circuitry 18 and a plurality of electronics packages 20 assembled thereto. The circuit board 12 and electronics packages 20 are essentially sandwiched on top and bottom side surfaces by first (upper) and second (lower) fluid cooling heat sink devices 30 and 40. The fluid cooling heat sink devices 30 and 40 pass cooling fluid therethrough to dissipate heat away from first (top) and second (bottom) side surfaces of the electronics package 20 and circuit board 12.

The electronics assembly 10 is held together via a pair of fastened together clamps 50 and 60. The first clamp 50 generally includes a shape configured to engage the periphery of the first heat sink device 30 and has a pair of pilot holes 52 for accurately positioning fasteners 54 (e.g., threaded screws). Similarly, the second clamp 60 has a shape configured to receive the periphery of the second heat sink device 40 and likewise has a pair of fastener receivers 62 (e.g., threaded receptacles) for receiving fasteners 54. Threaded fasteners 54 extend through corresponding pilot holes 52 and fastener receivers 62 to fasten the clamps 50 and 60 together. Clamps 50 and 60 essentially sandwich the periphery first and second heat sink devices 30 and 40 and hold the heat sink devices 30 and 40 in position which, in turn, sandwiches the circuit board 12 and electronics packages 20.

The substrate 12 may include a printed circuit board according to one embodiment, shown located generally in the midregion between upper and lower heat sink devices 30 and 40. The substrate 12 may be made of a low temperature co-fired ceramic (LTCC), an organic material such as FR4, a metal such as stainless steel, or any other suitable material. The substrate 12 may have electrical circuitry formed on the top side surface 14 and/or bottom side surface 16, as well as between laminated intermediate layers of the substrate 12. In the embodiment shown, substrate 12 has electrical current transmission circuitry 18 shown in dashed lines and formed in an intermediate layer, generally extending centrally between the electronics packages 20.

Assembled onto the printed circuit board 12 is the plurality of electronics packages 20 having electrical circuitry that generates thermal energy (heat) when conducting electrical current during operation. The electronics packages 20 are generally shown disposed within openings 22 formed in the printed circuit board 12 and are electrically connected to circuitry on the circuit board 12 via circuit connections 24. Accordingly, each of the electronics packages 20 has a top (upper) side surface exposed to contact the underside surface of upper heat sink device 30, and further has a lower side surface exposed to contact the upper side surface of lower heat sink device 40. While ten electronics packages 20 are generally shown in the exemplary embodiment, it should be appreciated that one or more electronics packages 20 may be employed on substrate 12 and cooled in accordance with teachings of the present invention.

Any of a number of electronics packages 20 may be employed which may include one or more semiconductor devices, such as transistors configured to provide controlled switching operation, operate as a diode, provide voltage regulation, or perform other functions. The electronics packages 20 may be fabricated semiconductor chips, such as flip chips with wire bonds or solder bump connections that are electrically and/or physically coupled to the substrate 12. Electronics packages 20 may also include resistors, capacitors, field effect transistors (FETS), isolated gate bipolar transistors (IGBTS), and other electrical devices. In a hybrid-electric or electric vehicle application, examples of the electronics packages application may include power inverters, DC to DC converters and DC to AC converters. Examples of such electronics packages having double-sided configurations that may be well suited for use in the electronics assembly 10 are disclosed in U.S. Pat. No. 6,812,553, the entire disclosure of which is hereby incorporated herein by reference.

The electronics assembly 10 of the present invention employs multiple fluid cooled heat exchange devices 30 and 40 disposed in thermal communication with multiple sides of the electronics packages 20 and substrate 12. The first and second heat sink devices 30 and 40 are shown disposed on opposite upper and lower side surfaces of the substrate 12 and electronics packages 20. The fluid cooled heat sink devices 30 and 40 operate to dissipate thermal energy (heat) away from the electronics packages 20 and substrate 12 for purposes of cooling the corresponding circuit board 12 and its electronics packages 20.

The first and second fluid cooled heat sink devices 30 and 40 each are configured having fluid receiving vessels 80 for receiving cooling fluid according to the embodiment shown. According to one exemplary embodiment, each of the first and second heat sink devices 30 and 40 may employ a stamping/brazing construction having a fluid vessel 80 with fin insert(s) 86 such as is disclosed in U.S. Pat. No. 6,639,798, the entire disclosure of which is hereby incorporated herein by reference. According to this construction, the first and second heat sink devices 30 and 40 may each have the fluid vessel 80 constructed utilizing upper and lower containment plates 82 and 84 joined by a brazing process to form the fluid vessel 80.

Hose barb fluid fittings 36 and 38 are attached and brazed on first heat sink 30, and similar hose barb fluid fittings 46 and 48 are attached and brazed on second heat sink 40. The hose barb fluid fittings 36 and 46 are each utilized as an inlet port to facilitate easy connection to a hose to receive fluid coolant from a fluid coolant source 88. Hose barb fluid fittings 38 and 48 each serve as an outlet port to pass the cooling fluid back to the fluid coolant source 88. Accordingly, cooling fluid passes into the inlet ports 36 and 46, through the cooling vessels 80, and out the outlet ports 38 and 48, respectively. The fluid coolant may then pass through a cooling radiator (not shown), such as an automotive vehicle radiator, before returning to the fluid coolant source 88.

The first and second heat sink devices 30 and 40 may include any of a number of internal fluid coolant flow configurations to enhance heat exchange. In one embodiment, one or more fin inserts 86 are formed within the fluid vessel 80. The fin inserts 86 may serve to stir up fluid coolant flowing through the fluid vessel 80 as well as multiply its internal wetted surface area.

The first and second heat sink devices 30 and 40 are each configured having a plurality of upstanding pedestals extending from the outer surface and adapted to come into thermal communication with corresponding electronics packages 20 and circuit board 12. The upper heat sink device 30 has a plurality of thermal conductive pedestals 32 formed in the lower side surface. Pedestals 32 are configured to align with the upper side surface of corresponding electronic packages 20. Disposed between pedestals 32 and the upper surface of electronic packages 20 is a thermal conductive medium 70, such as a thermal conductive adhesive or thermal conductive grease which serve as a thermal interface material to create a high performance interface.

Extending from the upper surface of the lower heat sink device 40 are a plurality of thermal conductive upstanding pedestals 42. Pedestals 42 are located so as to align with the bottom side surface of electronics packages 20 and are in thermal communication therewith to cool the bottom side of electronics packages 20. Disposed between each of pedestals 42 and the bottom side surface of electronics packages 20 is a thermal conductive medium 70, such as a thermal conductive adhesive or a thermal conductive grease that serves as a thermal interface material to create a high performance interface.

The upper heat sink device 30 further includes an upstanding elongated central pedestal 34 formed on the bottom surface to cool the substrate 12. Similarly, an upstanding elongated central pedestal 44 is formed on the upper surface of the lower heat sink device 40 to similarly cool the substrate 12. The elongated pedestals 34 and 44 are thermally conductive and are in thermal communication with the substrate 12, particularly in a location above and below, respectively, high-power electrical circuitry 18 formed on or within substrate 12. Additionally, a thermal conductive medium (not shown) may be disposed between each of the elongated pedestals 34 and 44 and the corresponding upper and lower surfaces of substrate 12. The thermal conductive medium may include a thermal conductive adhesive or a thermal conductive grease which serves as a thermal interface material to create a high performance interface.

Accordingly, the thermal conductive pedestals 32 and 42 provide an isolation distance to electrically isolate the substrate 12 from the upper and lower heat sink devices 30 and 40, and are in thermal communication with the electronics packages 20 to provide high performance cooling of the packages 20. Additionally, the elongated pedestals 34 and 44 provide additional cooling of the substrate 12, to further enhance the thermal cooling performance. The pedestals 32, 42, 34, and 44 are thermal conductive members that may be brazed onto the exterior surface of the heat sink vessels.

By forming pedestals 32, 42, 34, and 44 on the heat exchange surface, various advantages can be realized. High voltage isolation, the distance between exposed electrically conductive surfaces and the heat sink devices, can be maximized. By cooling the substrate 12, the amount of copper typically required to carry electrical current required for a given application can thereby be reduced. Accordingly, the electronics assembly 10 of the present invention advantageously provides for enhanced thermal performance by cooling electronics packages 20 and substrate 12 on multiple-side surfaces. While first and second fluid cooling heat sink devices 30 and 40 are shown and described herein, it should be appreciated that two or more such cooling fluid heat sink devices may be employed to cool one or more electronics packages 20 and substrate 12.

By enhancing the heat dissipation, particularly for high-powered electronics packages 20, the electronics assembly 10 advantageously allows for the reduction in the number and/or size of power packages used in the device, thereby reducing the size and cost of the overall assembly. Conversely, the inlet temperature of the coolant may be increased, thereby reducing the load on the fluid coolant system 80. Additionally, the enhanced heat dissipation achieved with the present invention may allow for an increase in the power output of the electronics packages 20 and substrate 12, thereby improving the overall performance of the electronics assembly 10. These and other advantages may be achieved by the novel cooling design of the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electronics assembly comprising:
    a substrate;
    at least one electronics package supported on the substrate, said electronics package comprising electrical circuitry and first and second side surfaces;
    a first heat sink device positioned in thermal conductive communication with the first side surface of the electronics package, wherein the first heat sink device comprises a fluid vessel containing fluid in an internal flow configuration;
    a second heat sink device positioned in thermal conductive communication with the second side surface of the electronics package, wherein the second heat sink device comprises a fluid vessel containing fluid in an internal flow configuration;
    a first thermal conductive medium disposed between the first side surface of the electronics package and the first heat sink device and in contact with the electronics package and the first heat sink device; and
    a second thermal conductive medium disposed between the second side surface of the electronics package and the second heat sink device and in contact with the electronics package and the second heat sink device.

2. The electronics assembly as defined in claim 1, wherein the first heat sink device comprises a first thermally conductive pedestal in thermal communication with the first side surface of the electronics package, and wherein the second heat sink device comprises a second thermally conductive pedestal in thermal communication with the second side surface of the electronics package.

3. The electronics assembly as defined in claim 1, wherein each of the first and second heat sink devices comprises a pedestal in thermal communication with the substrate.

4. The electronics assembly as defined in claim 1, wherein the substrate comprises a circuit board having electrical circuitry.

5. The electronics assembly as defined in claim 1, wherein the first and second thermal conductive mediums each comprises a single continuous layer of thermal conductive adhesive.

6. The electronics assembly as defined in claim 5, wherein the first and second thermal conductive mediums each comprises a thermal conductive grease.

7. The electronics assembly as defined in claim 1, wherein each fluid vessel comprises first and second containment members.

8. The electronics assembly as defined in claim 7, wherein the cooling fluid comprises liquid.

9. The electronics assembly as defined in claim 1, wherein the electronics assembly is employed on an automotive vehicle.

10. The electronics assembly as defined in claim 1 further comprising a support structure for positioning the first and second heat devices on opposite first and second side surfaces of the electronics package and the substrate.

11. An automotive electronics assembly comprising:
    a circuit board substrate;
    at least one electronics package supported on the substrate, said electronics package comprising electrical circuitry and opposite first and second side surfaces;
    a first heat sink device positioned in thermal conductive communication with the first side surface of the electronics package;
    a second heat sink device positioned in thermal conductive communication with the second side surface of the electronics package, wherein the first and second heat sink devices each comprises a fluid vessel containing a cooling fluid in an internal flow configuration;
    a first thermal conductive medium disposed between the first side surface of the electronics package and the first heat sink device and in contact with the electronics package and the first heat sink device; and
    a second thermal conductive medium disposed between the second side surface of the electronics package and the second heat sink device and in contact with the electronics package and the second heat sink device.

12. The electronics assembly as defined in claim 11, wherein the electronics package comprises a power device for use in an electric vehicle.

13. The electronics assembly as defined in claim 11, wherein the fluid vessel is in fluid communication with a vehicle radiator.

14. The electronics assembly as defined in claim 11, wherein the cooling fluid comprises liquid.

15. A method of cooling electronics in an electronics assembly, said method comprising the steps of:
    providing at least one electronics package supported on a substrate;
    providing a first thermal conductive medium in contact with a first side surface of the electronics package;

disposing a first heat sink device in thermal conductive communication with the first side surface of the electronics package, wherein the first heat sink device is in contact with the first thermal conductive medium;

providing a second thermal conductive medium in contact with a second side surface of the electronics package;

disposing a second heat sink device in thermal conductive communication with the second side surface of the electronics package, wherein the second heat sink device is in contact with the second thermal conductive medium; and cooling the electronics package by flowing cooling fluid through the first and second heat sink devices to dissipate heat away from the first and second side surfaces of the electronics package, wherein the first and second heat sink devices each comprises a fluid flow vessel with an internal flow configuration.

16. The method as defined in claim 15, wherein the step of cooling comprises passing a cooling liquid through the fluid flow vessel of each of the first and second heat sink devices.

17. The method as defined in claim 15, wherein the steps of disposing first and second thermal conductive mediums each comprises disposing one of a single continuous layer of thermally conductive adhesive and a thermal conductive grease.

18. The method as defined in claim 15 further comprising the step of locating the electronics assembly on an automotive vehicle.

19. The method as defined in claim 15, wherein the steps of disposing the first and second heat sink devices comprise disposing the first and second heat sink devices on opposite first and second side surfaces of the electronics package and the substrate.

20. The method as defined in claim 15, wherein the steps of disposing the first and second heat sink devices comprises disposing pedestals of the first and second heat sink devices in thermal communication with the electronics package.

21. The method as defined in claim 20, wherein the steps of disposing first and second heat sink devices comprises disposing further pedestals in thermal communication with the substrate.

* * * * *